US 6,431,749 B1

(12) United States Patent
Tolant et al.

(10) Patent No.: US 6,431,749 B1
(45) Date of Patent: Aug. 13, 2002

(54) METHOD AND DEVICE TO MEASURE THE TEMPERATURE OF MICROWAVE COMPONENTS

(75) Inventors: Clément Tolant, Rouen; Joël Cordier, Amfreville les Champs; Philippe Eudeline, Le Mesnil Esnard; Patrick Servain, La Haye Aubree, all of (FR)

(73) Assignee: Thomson-CSF, Paris (FR)

( * ) Notice: Subject to any disclaimer, the term of this patent is extended or adjusted under 35 U.S.C. 154(b) by 6 days.

(21) Appl. No.: 09/718,485

(22) Filed: Nov. 24, 2000

(30) Foreign Application Priority Data

Nov. 30, 1999 (FR) .............................. 99 15094

(51) Int. Cl.[7] .......................... G01K 3/02; G01R 31/26
(52) U.S. Cl. .................... 374/102; 374/141; 374/43; 324/766
(58) Field of Search ................ 374/102, 141, 374/100, 101, 43, 44, 45; 324/765, 766, 767, 768, 769

(56) References Cited

U.S. PATENT DOCUMENTS 5,341,287 A    8/1994  Cordier et al. ............... 700/28
5,694,051 A  * 12/1997  Ueyama et al. ............. 324/768

FOREIGN PATENT DOCUMENTS

EP          0 336 814 A1    10/1989

OTHER PUBLICATIONS

Par R. Berlioux, "Le test des semiconducteurs de puissance", Toute L'electronique, FR, Societe Des Editions Radio, No. 501, Feb. 1985, pp. 59–62.
Mark C. Leifer, "Junction Temperature Measurements in Reverse–Biased Pin Diodes", Review of Scientific Instruments, US, American Institute of Physics, vol. 65, No. 2, Feb. 1, 1994, pp. 472–476.

* cited by examiner

Primary Examiner—Diego Gutierrez
Assistant Examiner—Stanley J. Pruchnic, Jr.
(74) Attorney, Agent, or Firm—Oblon, Spivak, McClelland, Maier & Neustadt, P.C.

(57) ABSTRACT

In a method and a device for the measurement of the mean temperature of components, a sequence of test pulses of increasing duration is applied to the component, the power of the pulses representing a state of operation of the component, a measurement of junction temperature being performed at the end of each pulse to obtain a curve representing the progress of the junction temperature of the component as a function of time on the basis of the temperature measurement points obtained at the end of each pulse. The disclosed method and device can be applied especially to determine the junction temperature of microwave electronic components working in continuous mode or in pulsed mode.

10 Claims, 4 Drawing Sheets

METHOD AND DEVICE TO MEASURE THE TEMPERATURE OF MICROWAVE COMPONENTS

BACKGROUND OF THE INVENTION

1. Field of the Invention

The present invention relates to a method and a device to measure the mean temperature of components. It can be applied especially to the determining of the junction temperature of microwave electronic components working in continuous wave (CW) mode or in pulse mode.

2. Description of the Prior Art

Radar techniques use, in particular, microwave circuits capable of conveying high power values, such as phase-shifters, limiters or, again, power amplifiers. These amplifiers, which are sometimes called "solid-state" amplifiers, use especially semiconductor-based microwave components such as, for example, class C biased power bipolar transistors. However, the limiters and the phase-shifters most commonly use diodes and, especially, PIN diodes. These different components generally work in radar mode, namely in pulsed operation. In this working mode, the wave is sent by the radar in the form of pulses whose length and repetition period may be fixed or variable in time.

In the microwave components referred to here above such as, for example, the transistors or the diodes, it is important to know the temperature attained by the junction of the component, because this temperature determines the life expectancy of this component. To this end, manufacturers generally provide information on the thermal characteristics of the components and, especially, the thermal resistance R$th$ which is defined by the following relationship:

$$R_{th}=(q_j-q_s)/P_d \quad (1)$$

where $q_j$ is the junction temperature of the component, , $q_s$ is the temperature of the component taken at the level of the package and $P_d$ is the power dissipated by the component.

While this feature is valuable for knowing the junction temperature in CW mode, it proves to be insufficient to deal with cases of pulsed operation where it is necessary to introduce the concept of thermal impedance. Indeed, the junction temperature of the component in pulsed mode is closely related to the type of operating microwave frequency used. Taking into account of the progress of the junction temperature is a very important operation, for example when managing and forecasting the life expectancy of a component, especially when making computations on reliability or operational safety, as well as in order to understand special phenomena such as, for example, the phase variation of the microwave signal during successive pulses.

There are methods to determine the junction temperature of the components, especially transistors. These methods make use of current/voltage electrical measurements. In particular, a known current is injected into the transistor and the variation of its base-emitter voltage DVBE is measured. These methods are based on a known property of bipolar transistors according to which, for a given constant current i flowing through the base-emitter junction, any variation in the temperature of the junction causes a variation in the base-emitter voltage VBE according to a known linear relationship. By measuring the variation of this voltage therefore, it is possible, for a given injected current, to determine the variation in junction temperature.

These methods are used solely to determine the temperature when the thermodynamic balance of the component is attained, namely when its temperature is practically stabilized. The value thus obtained corresponds to a maximum value of the junction temperature of the component. Furthermore, the microwave operating frequencies to which the components are subjected during testing generally correspond to fixed pulse widths and repetition periods. Now these measurements give no indication of the precise changes undergone by the junction temperature of the component during the pulses and outside the pulses for a working frequency that starts at the instant t=0 and especially with respect to new modes of radar operation where the pulse widths and the repetition periods are no longer necessarily fixed during one and the same burst of pulses.

The aim of the invention is to overcome the above-mentioned drawbacks, to provide especially for a precise indication of the progress of the mean temperature of the component throughout the phases of the microwave operating frequency both during the pulses and outside the pulses.

SUMMARY OF THE INVENTION

To this end, an object of the invention is a method for the measurement of the junction temperature of a component where a sequence of test pulses of increasing width is applied to the component. The peak microwave power of the test pulses represents a state of operation of the component, for example the nominal state of operation. A measurement of junction temperature is performed at the end of each pulse to obtain a curve representing the progress of the junction temperature of the component as a function of time on the basis of the temperature measurement points obtained at the end of each pulse.

The invention also relates to a device for the implementation of the method according to the invention.

The main advantages of the invention are that it can be used to prepare the mean temperature profile of the component as a function of the operating variables of a component, improves the electrothermal models used for the simulation of the circuits, optimizes the electrical circuits, gives a better understanding and better quantification of the temperature-related influences on the electrical characteristics of the circuits, especially with regard to the changes, in time, of their electrical characteristics, and is simple to implement.

BRIEF DESCRIPTION OF THE DRAWINGS

Other characteristics and features of the invention shall appear from the following description with reference to the appended figures, of which:

FIG. 5 shows pulses illustrating the conditions of operation of a microwave component in a continuous wave mode starting at the instant to;

MORE DETAILED DESCRIPTION

Figure 1:
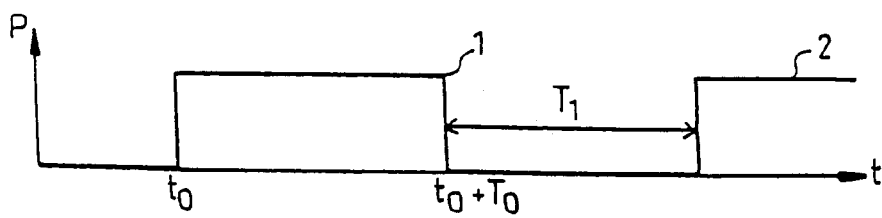
FIG. 1 shows pulses illustrating the conditions of microwave operation of a component working in pulsed mode.

FIG. 1 illustrates a train of chopped microwave pulses with a first pulse 1 and the start of a second pulse 2 in an axial system where the y-axis represents the microwave power P arriving at a component being tested and the x-axis represents the time t. The first pulse 1 starts at a time t0 and ends at a later time t0+T0. These two nominal pulses are for example representative of a radar operation mode. They actually represent the conditions in which the component will progress. In particular, the power P of an incident pulse represents a state of instantaneous operation of the component.

According to the invention, a sequence of microwave signal pulses of growing length and preferably constant power are sent to the component at least until the duration of the last pulse reaches the duration T0 of the nominal pulse 1. The duration of the last pulse may be equal for example to this duration T0. These test pulses increase, for example, evenly, i.e. according to a step with a constant duration from one pulse to the other. The sequence of pulses preferably represents conditions of operational functioning of the component, especially its progress in time.

A temperature measurement is performed at the end of each pulse, namely when the microwave signal is no longer present on the component, in such a way that only the measurement current, which is of known value, goes through the component, the temperature being measured by means of a standard current/voltage method. The injected current $I_m$ is constant and equal for example to some milliamperes. It is injected into the component at the end of the cycle when the microwave signal is no longer present at the input of the component. The associated voltage $V_j$ is then quickly read at the terminals of the component. This voltage is, for example, the voltage between the base and the emitter of a bipolar transistor or the junction voltage of a diode. A table representing the changes in the static characteristics of the component as a function of the temperature then gives an indication, in a known way, of the junction temperature corresponding to the pair $(I_m, V_j)$ thus defined.

Figure 2:
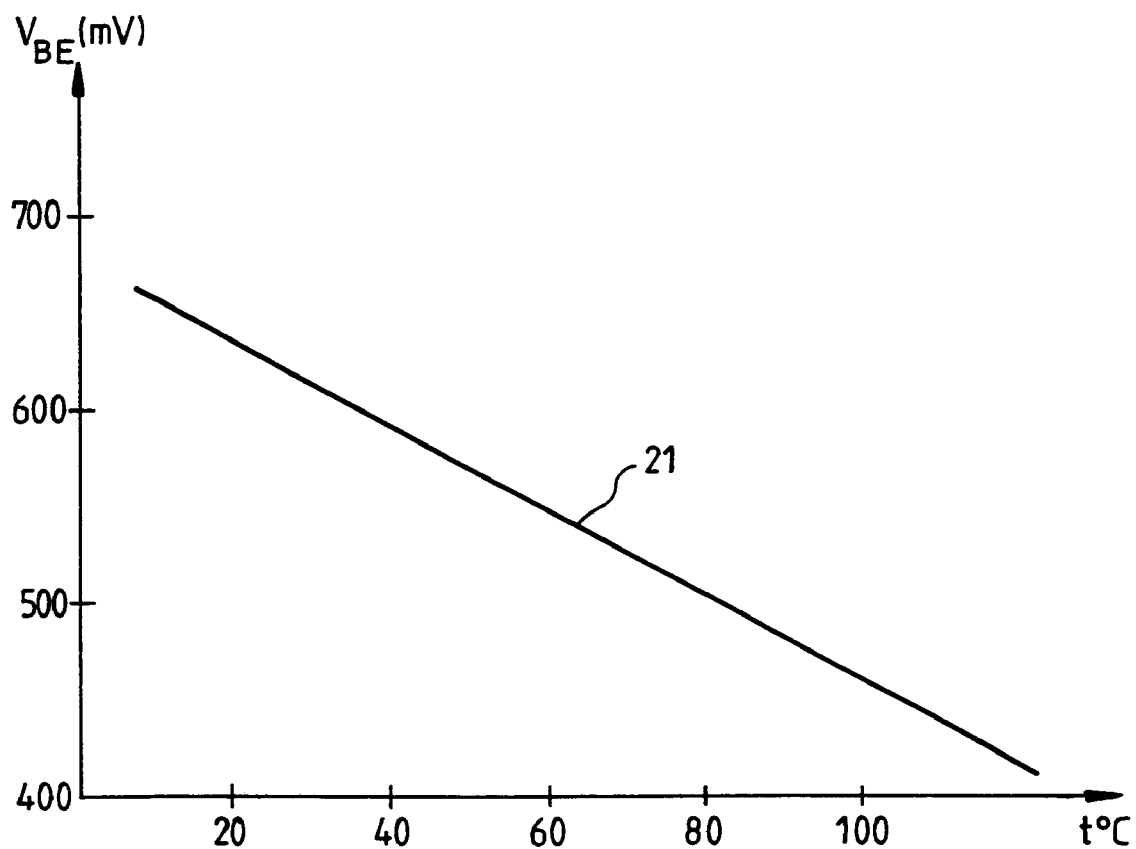
FIG. 2 shows an example of the progress of the mean junction temperature of a component as a function of its static characteristics.

FIG. 2 illustrates this table, represented in the form of a graph, by a curve 21 in an axial system for a given measurement current. The y-axis represents the voltage $V_{BE}$ at the terminals of the junction of the component which is for example the voltage between the base and the emitter of a bipolar transistor or the voltage at the terminals of a diode junction. The x-axis represents the temperature of the junction. The curve 21 can be easily stored either by discrete values or by a mathematical equation because it has the form of a straight line.

FIGS. 3a to 3d illustrate the sequence of microwave pulses applied to the component being tested. When these incident signals reach diodes or transistors, the thermal situation and hence the junction temperature in these components is modified. It is enough, after each pulse, to swiftly read the current-voltage pair (I, V) representing the junction temperature. Between each measurement, it may be necessary to wait for the temperature of the component to fall back to the initial ambient temperature.

Figure 3A:
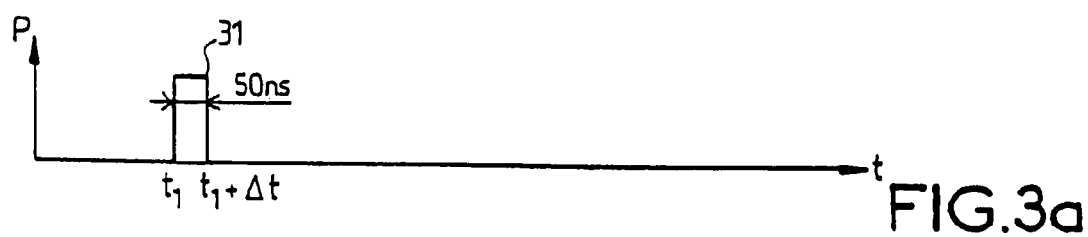
FIGS. 3a to 3d exemplify sequences of microwave pulses of tests applied to a component according to a method of the invention, and in the case where the nominal operating mode of the component is a pulsed mode.
Figure 3B:
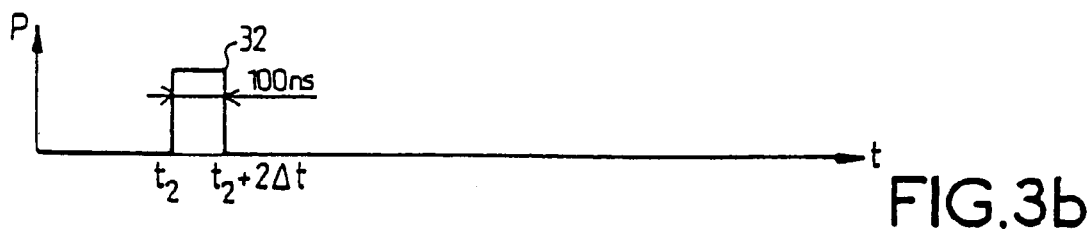
Figure 3C:
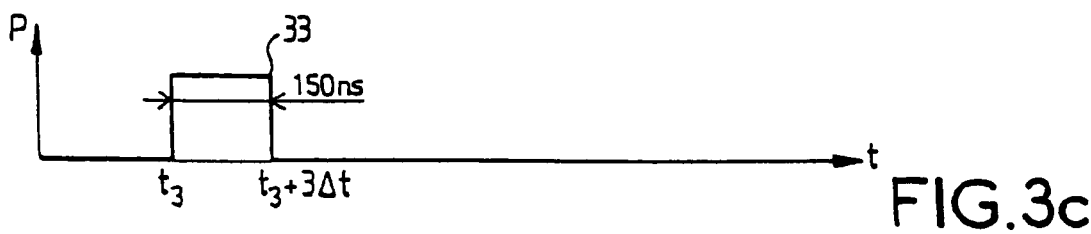

FIG. 3a illustrates a first pulse 31, applied from a time $t_1$ for a duration Dt, for example in the range of 50 ns. This pulse makes the junction temperature of the component rise. At the end of this pulse, for example at the time $t_1$+Dt, a measurement of the junction temperature is obtained by injection of the measurement current $I_m$ and measurement of the junction voltage $V_j$. When the junction temperature of the component falls back to the ambient temperature, or to any other reference temperature, a second pulse 32 is applied to the component. This second pulse 32 is therefore applied from a time $t_2$ later than the time $t_1$, for example for a duration 2Dt. To illustrate the method according to the invention more clearly, the times $t_1$ and $t_2$, like the other test pulse starting times referred to hereinafter, are aligned in all the FIGS. 3a to 3d. FIG. 3c illustrates the case of a third pulse 33 applied to the microwave component. This pulse is applied once the junction temperature has returned to the reference temperature, starting from a time $t_3$ for a duration equal for example to 3Dt.

Figure 3D:
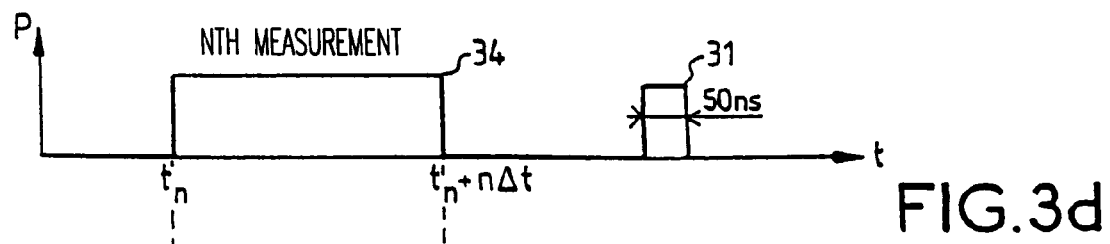

FIG. 3d illustrates the nth measurement, or nth order measurement, performed on the microwave component. A test pulse 34 is therefore applied to it on the basis of a time $t_n$, or example for a duration nDt. The duration of this pulse is for example such that it is equal to the duration T0 of the nominal pulse 1. If the pulses increase evenly according to the step Dt, this step is then for example computed as a function of the duration t0 of the nominal pulse in such a way that the step of the duration Dt is substantially equal to T0/n.

To measure the progress of the junction temperature between the first nominal pulse 1 and the second nominal pulse 2, the test current injected into the microwave component remains present and constant in a microwave component after the nth test pulse applied to the component. Samples of voltages at the terminals of the junction of the component are then taken, for example regularly according to the step Dt, to define the progress of the temperature between the two pulses 1, 2.

The current measurement $I_m$ is for example held in the component during the inter-pulse duration $T_1$ from the first nominal pulse 1 to the second nominal pulse 2. During this period $T_1$, junction voltage values continue to be sampled to determine points of measurement of junction temperature between the two pulses 1, 2. At the end of $T_1$, the measurement current is for example eliminated from the component and a new sequence of test pulses is then applied to the component, starting with the first pulse 31 of the sequence, which has a duration Dt like the preceding sequence but may be different. The new reference temperature of the junction is no longer the same as it is during the first sequence of test pulses. In particular, it is no longer the ambient temperature but the temperature $q_1$ of the junction reached at the end of the inter-pulse period just before the start of the second nominal pulse 2. To this end, the first test pulse 31 is sent just after the inter-pulse duration $T_1$.

Figure 4:
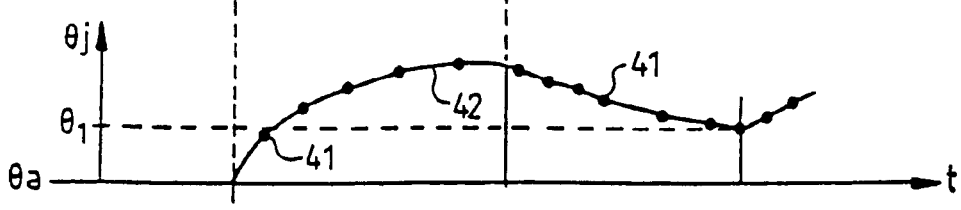
FIG. 4 exemplifies a curve of the progress of the junction temperature of the above-mentioned component obtained by the method according to the invention.

FIG. 4 illustrates the form of the junction temperature $q_j$, obtained as a function of the time t, from a reference temperature $q_a$, for example the ambient temperature. The temperature measurements performed at the end of the test pulse within the pulse duration and outside it give measurement points 41 from which a junction temperature curve 42 may be defined by an extrapolation, which is linear or quadratic for example. The temperature curve corresponding to the second nominal pulse 2 starts from the above-mentioned temperature $q_1$. The precision of this measurement of junction temperature $q_j$ between the pulses is not perfect owing to the fact that the measurement pulse may slightly affect the thermal condition of the component. For more precise measurements, it is possible to process the inter-pulse case, namely the case between the pulses, as an intra-pulse measurement, namely within one and the same pulse, by successively injecting the microwave test pulses associated with current-voltage measurements (I, V) at different places of the inter-pulse region, especially by the successive injection, at staggered times, of the current pulses needed to measure the temperature.

Figure 5:
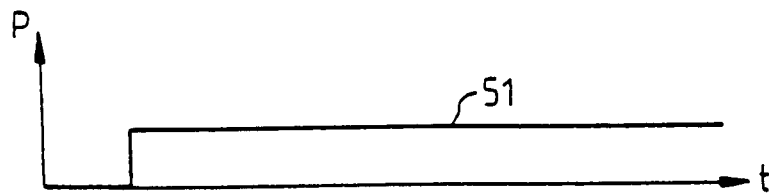
Figure 6A:
FIGS. 6a to 6c exemplify sequences of microwave pulses of tests supplied to a component according to a method of the invention, when the nominal mode of operation of the component is a continuous mode starting at t0.
Figure 6B:
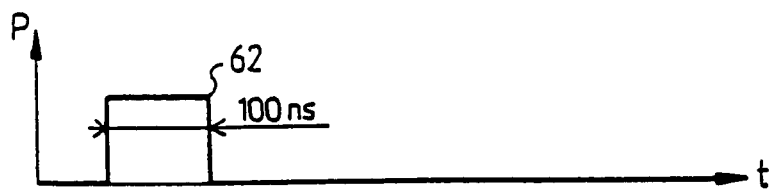
Figure 6C:

The method according to the invention can also be applied when the microwave component is subjected to a continuous wave mode of operation starting at the instant $t_0$ as illustrated by the curve 51 of FIG. 5. This curve 51 shows the conditions in which the component will progress by representing its incident power P as a function of the time t. A sequence n of test pulses 61, 62, 63 can similarly be applied to the sequence applied to the component within one and the same nominal pulse as described in the case of the previous pulse mode. These n test pulses are illustrated by FIGS. 6a, 6b and 6c. The injection of the measurement current lm into the component is done at the end of the test pulse, namely when the microwave signal produced by the test pulse is no longer present in the component.

Figure 7:
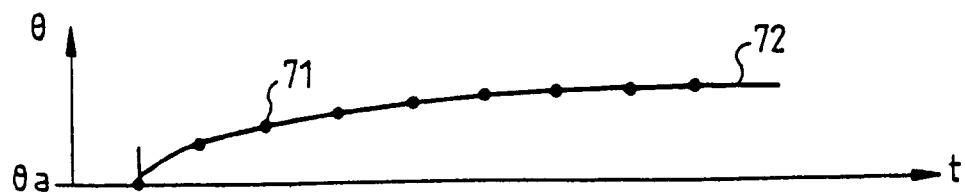
FIG. 7 is an exemplary curve illustrating the progress of junction temperature of the above-mentioned component obtained by a method according to the invention.

FIG. 7 illustrates a curve 72 representing the progress of the temperature of the junction of the component, starting from a reference temperature, for example the ambient temperature $q_a$. This curve is obtained by extrapolation from n temperature measurement points 71 obtained after each test pulse. The nth and last pulse 63 of the sequence is for example such that it gives a measurement of temperature identical to the one produced by the previous n−1 order pulse. The last pulse 63 therefore corresponds to the stabilized thermal mode of operation.

A measurement of temperature is initialized by the end of a test pulse 31, 32, 33, 34, 61, 62, 63 by an injection of the measurement current lm into the component. To implement this measurement, it is possible, for example, to provide for the controlling of the measurement current lm generation circuit, from the trailing edge of the test pulses. The current injected into the component is of a pulsed type with a very small pulse width, in the range of some nanoseconds, and is related to the time needed to read the corresponding voltage. This current pulse may be controlled for example by a switched current generator.

Figure 8:
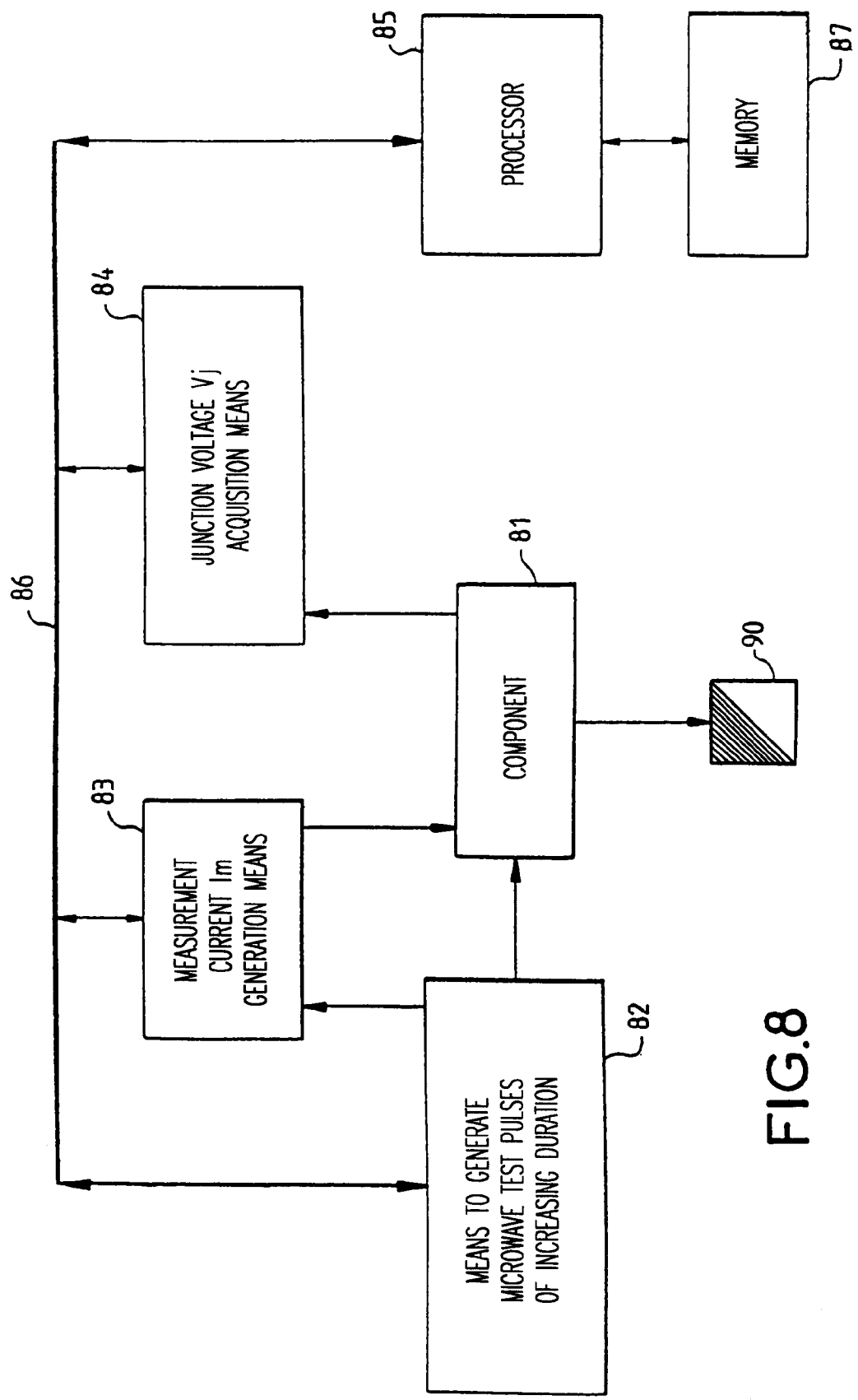
FIG. 8 exemplifies an embodiment of a device for the implementation of the method according to the invention.

FIG. 8 illustrates for example a measurement stand for the implementation of the method according to the invention. It enables measurements of the temperatures previously described on a component 81. In testing, this component is connected to a microwave load 90, for example a 50-ohm load. A stand of this kind is simple to make. It may be made especially out of processors, memory circuits and switches/ selectors. The processor or processors must be capable of performing fast processing operations. The storage memories must have high capacity. The switches must have high selection-switching speeds. The interconnection circuits must furthermore give high data bit rates. All these types of circuits are commercially easily available and can be associated with one another without difficulty.

The measuring stand therefore has means 82 to generate microwave test pulses of increasing duration. It must indeed enable the generation of microwave test pulses, for the component, that have variable widths and start at precise points in time. This function may be fulfilled for example by a digital pulse synthesis comprising a high-capacity storage memory associated with a high bit rate bus. The minimum test pulse widths may, for example, be about 30 ns. The width of the pulses and especially the pitch Dt from one pulse to another may be obtained by programming from the nominal pulse widths to which the component is subjected. All the technology of the above-mentioned commands as well as the processing and display of the data may be controlled by a commercially available software program. The test microwave pulse generation means conventionally comprise a pulse generation card associated with a generator and a microwave chopper.

The measuring stand has means 83 to inject a constant measurement current lm with a value known beforehand into the component at the end of each test microwave pulse. This injection is activated, for example, by the trailing edge of the pulse. It also has means 84 for the acquisition of the voltage $V_j$ at the terminals of the junction of the component. This acquisition is done, for example, by an analog-digital converter with high conversion speed. An 8-bit coding may be enough. For a number of conversion bits such as this, it is easy to find fast low-cost converters.

The above means 82, 83, 84 are connected to a processor 85 by a bus 86 which is preferably working at high bit rate. This processor 86 controls all these means through appropriate interfaces. The processor is furthermore connected to a memory 87. This memory has a read-only memory part which contains especially the different possible test programs but also tables for the conversion of the junction voltage into junction temperature as illustrated in FIG. 2. This memory part also has, for example, parameters of equations. The memory 87 also has a random-access memory part especially for storing voltage measurements given by the acquisition means 84 as well as for storing the temperature measurement points 41, 71 indicating the progress in temperature of the component 81. Display means not shown may be provided to illustrate the temperature progress curves 42, 72.

The invention brings certain advantages. It is used to prepare the temperature profile of the component whatever the type of working frequency chosen. It therefore bring about an improvement in the models used for thermoelectric simulation of the circuits through a precise tracking of the progress in temperature of a component being tested. It can be used to optimize electrical circuits by a more precise measurement of the junction temperature. It furthermore provides for a clearer understanding and a better quantification of the influences related to temperature on the electrical characteristics of the circuits, especially with regard for example to the progress of the phase of the microwave signal during successive pulses.

The invention has been described in relation to the measurement of the progress of the junction temperature of microwave components. These components in particular may be transistors or diodes. In the case of bipolar transistors, the junction voltage corresponds to the voltage between the base and the transmitter.

The measurement of junction temperature of the component has been described with reference to an injection of DC current accompanied by a measurement of junction voltage at the end of the microwave pulse. However it is possible to apply the method according to the invention with another method of temperature measurement and other types of components.

What is claimed is:

1. A method for measurement of temperature at a junction of a component, comprising the steps of:

applying a sequence of microwave test pulses of increasing duration to the component, and performing the measurement of junction temperature at an end of each pulse to obtain a curve representing progress of the junction temperature of the component as a function of time on a basis of temperature measurements obtained at the end of each pulse, wherein a duration of a last pulse of the sequence is approaching a duration of an operating pulse of the component.

2. A method according to claim 1, wherein the temperature measurements are performed by injection of a given measurement current into the component followed by a measurement of voltage at terminals of the junction of the component, the junction temperature being a function of measured voltage.

3. A method according to claim 1, wherein the duration increases from one pulse to another according to a constant step.

4. A method according to claim 1, wherein the duration of the last pulse is equal to the duration of the operating pulse of the component.

5. A method according to claim 1 wherein, with the component progressing in a continuous wave mode of operation, the last pulse, which is an nth order pulse, is such that it gives the measurement of the junction temperature equal to that produced by a preceding pulse, which is an n−1 order pulse.

6. A method according to claim 1, wherein a test pulse is applied once a rise in temperature prompted by a preceding pulse has fallen back to a reference temperature.

7. A method according to claim 6, wherein the reference temperature is an ambient temperature.

8. A method according to claim 2 wherein, with the component progressing in a pulsed mode, the given measurement current is held in the component for a duration from one operating pulse to a following one, junction voltage values continuing, during this duration, to be sampled to determine junction temperature measurements between the one operating pulse and the following one.

9. A method according to claim 1 wherein, in an inter-pulse zone, the measurement of the junction temperature is made as in an intra-pulse zone by successive injection, at staggered times, of current pulses needed for the measurement of the junction temperature.

10. A device for implementation of the method according to claim 1, for measurement of temperature at a junction, comprising:

a generator for microwave test pulses of increasing duration, these pulses being applied to a component;

an injector for a measurement current into the component;

an acquisitioner for junction voltage of the component;

a memory having a correspondence between the junction voltage of the component and its temperature; and a processor that controls the generator, the injector and the acquisitioner by interfaces, a test program being recorded in the memory.

* * * * *